(12) United States Patent
Jung

(10) Patent No.: US 11,812,591 B2
(45) Date of Patent: Nov. 7, 2023

(54) ELECTRONIC COMPONENT ASSEMBLY

(71) Applicant: LG INNOTEK CO., LTD., Seoul (KR)

(72) Inventor: Jae Hoo Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 104 days.

(21) Appl. No.: 17/287,284

(22) PCT Filed: Oct. 24, 2019

(86) PCT No.: PCT/KR2019/014077
§ 371 (c)(1),
(2) Date: Apr. 21, 2021

(87) PCT Pub. No.: WO2020/101214
PCT Pub. Date: May 22, 2020

(65) Prior Publication Data
US 2021/0400851 A1    Dec. 23, 2021

(30) Foreign Application Priority Data
Nov. 14, 2018   (KR) ........................ 10-2018-0139798

(51) Int. Cl.
*H05K 7/14* (2006.01)
*H05K 7/20* (2006.01)

(52) U.S. Cl.
CPC ....... *H05K 7/20927* (2013.01); *H05K 7/1401* (2013.01); *H05K 7/209* (2013.01)

(58) Field of Classification Search
None
See application file for complete search history.

(56) References Cited

U.S. PATENT DOCUMENTS 7,417,861 B2 *  8/2008  Kikuchi ................. H05K 7/209
                                                      257/E25.031
8,477,502 B2 *  7/2013  Single ..................... B25F 5/008
                                                      361/720
(Continued)

FOREIGN PATENT DOCUMENTS

JP        2003086970        3/2003
JP        2010-239047       10/2010
(Continued)

OTHER PUBLICATIONS

International Search Report dated Jan. 30, 2020 issued in Application No. PCT/KR2019/014077.
(Continued)

*Primary Examiner* — Courtney L Smith
(74) *Attorney, Agent, or Firm* — KED & Associates LLP

(57) ABSTRACT

The present embodiment relates to an electronic component assembly comprising: a housing; a heating element disposed inside the housing; a substrate disposed on the heating element; and a spacer disposed between the heating element and the substrate, wherein the substrate has a first hole coupled to the spacer, the heating element includes a first body having a second hole formed therethrough, and a connection part connected to the substrate, and the spacer includes a first protrusion coupled to the first hole, a second protrusion coupled to the second hole, and a second body disposed between the first protrusion and the second protrusion.

18 Claims, 2 Drawing Sheets

(56) References Cited

U.S. PATENT DOCUMENTS

| | | | |
|---|---|---|---|
| 9,119,327 B2 | 8/2015 | Albrecht, III et al. | |
| 10,498,195 B2* | 12/2019 | Mergener | H02K 7/145 |
| 10,524,375 B2* | 12/2019 | Kogure | H02M 7/48 |
| 10,542,640 B1* | 1/2020 | Leigh | H05K 7/20772 |
| 2003/0056965 A1 | 3/2003 | Tsuchiyama | |
| 2004/0140554 A1* | 7/2004 | Kataria | H01L 23/4006 |
| | | | 257/E23.09 |
| 2006/0092611 A1* | 5/2006 | Beihoff | H05K 7/20927 |
| | | | 361/698 |
| 2008/0007919 A1* | 1/2008 | Isomoto | H05K 7/209 |
| | | | 361/709 |
| 2013/0277820 A1* | 10/2013 | Hotta | H01L 23/473 |
| | | | 257/712 |
| 2014/0252587 A1* | 9/2014 | Kodama | H05K 7/2049 |
| | | | 257/712 |
| 2016/0295734 A1* | 10/2016 | Ueda | H05K 7/1432 |

FOREIGN PATENT DOCUMENTS

| | | |
|---|---|---|
| JP | 2016021474 | 2/2016 |
| KR | 20-2000-0009735 | 6/2000 |
| KR | 10-2007-0048881 | 5/2007 |
| KR | 10-2017-0048032 | 5/2017 |

OTHER PUBLICATIONS

European Search Report dated Jun. 23, 2022 issued in Application 19884188.4.
Japanese Office Action dated Jul. 4, 2023 issued in Application No. 2021-525824.

* cited by examiner

ELECTRONIC COMPONENT ASSEMBLY

CROSS-REFERENCE TO RELATED PATENT APPLICATIONS

This application is a U.S. National Stage Application under 35 U.S.C. § 371 of PCT Application No. PCT/KR2019/014077, filed Oct. 24, 2019, which claims priority to Korean Patent Application No. 10-2018-0139798, filed Nov. 14, 2018, whose entire disclosures are hereby incorporated by reference.

TECHNICAL FIELD

The present embodiment relates to an electronic component assembly.

BACKGROUND ART

Engine electric devices (starting devices, ignition devices, charging devices) and lighting devices are generally used as electric devices of automobiles, but in recent years, most systems including chassis electric devices are becoming electrified as vehicles are more electronically controlled.

Various electrical equipment such as lamps, audio, heaters, air conditioners, and the like installed in automobiles are supplied with power from the battery when the vehicle is stopped, and power from the generator when driving, and at this time, the power generation capacity of the 14V power system is used as the normal power supply voltage.

Recently, with the development of the information technology industry, various new technologies (motor-type power steering, Internet, and the like) aiming to increase the convenience of automobiles are being adopted into vehicles, and the development of new technologies capable of maximally utilizing the current automotive system is expected to be continued in the future.

Regardless of the soft or hard type, the hybrid electric vehicle (HEV) is equipped with a low voltage DC-DC converter to supply 12V electric load. In addition, the DC converter, which serves as a generator (alternator) of a general gasoline vehicle, is supplying a voltage of 12V for electric load by stepping down the high voltage of the main battery (usually a high voltage battery of 144V or higher).

The DC-DC converter refers to an electronic circuit device that converts a DC power supply of a certain voltage to a DC power supply of a different voltage, and is used in various areas such as television receivers and automotive electronics.

Meanwhile, in the case of an electronic component assembly applied to the DC converter as described above, it is being developed in a form that minimizes the space of power components according to the trend of miniaturization. In particular, in the case of a high power electronic component assembly among the power modules of the DC converter, a heating element (FET) with high heat generation characteristics is located on the outside of the substrate for heat dissipation, and since it is manufactured in a form connected to the substrate through a lead, there is a disadvantage in terms of space utilization of the substrate.

DETAILED DESCRIPTION OF THE INVENTION

Technical Subject

The present invention devised to overcome the above disadvantages aims to provide an electronic component assembly with high space utilization of a substrate by rapidly discharging heat generated by a heating element such as a switching element and at the same time disposing a heating element body at the inner side of a substrate.

Technical Solution

In order to achieve the above object, an electronic component assembly according to the present embodiment comprises: a housing; a heating element disposed inside the housing; a substrate disposed on the heating element; and a spacer disposed between the heating element and the substrate, wherein the substrate has a first hole coupled to the spacer, wherein the heating element includes a first body having a second hole formed therethrough, and a connection part connected to the substrate, and wherein the spacer includes a first protrusion coupled to the first hole, a second protrusion coupled to the second hole, and a second body disposed between the first protrusion and the second protrusion.

Preferably, the heating element is disposed on one surface of the housing and includes an upper surface in contact with the spacer.

Preferably, the substrate includes a plurality of first holes, and the spacer includes a plurality of first protrusions.

Preferably, a plurality of heating elements is provided, the second body of the spacer includes a plurality of second protrusions, and each of the plurality of second protrusions is coupled to the second hole of each of the plurality of heating elements.

Preferably, the housing is made of a metal material and includes a cooling channel through which a refrigerant for cooling is circulated.

Preferably, a heat conducting member is disposed on the contact surface between the heating element and the housing.

Preferably, the plurality of heating elements is disposed to be spaced apart at an equal interval.

Preferably, the spacer is formed of an elastic material or a plastic material.

Preferably, a second body of the spacer includes a stopper having a diameter larger than that of the first protrusion and an extension part connected to the stopper, and a portion of the stopper is in contact with the substrate.

More preferably, the spacer includes a second body in contact with all of the plurality of heating elements, the stopper includes a first stopper and a second stopper disposed on both sides of the extension part, and the distance between the substrate and the first body of the heating element is equal to the sum of the thicknesses of the stopper and the extension part.

Preferably, the plurality of second protrusions is disposed to be spaced apart at an equal interval.

In addition, an electronic component assembly according to the present embodiment comprises: a housing including a base; a substrate disposed on the base; a heating element disposed between the substrate and the base; and a spacer disposed between the heating element and the substrate, wherein the heating element is fixed to the base by the spacer and spaced apart from the substrate.

Advantageous Effects

In the present embodiment, a heating element having high heat generation characteristics is disposed in the same direction being spaced apart a certain distance from the lower surface of the substrate, and a spacer is disposed between the heating element and the substrate so as to be in contact with the housing in which the cooling channel is formed with an appropriate pressure when the substrate is mounted inside the case, and other components can be mounted on the substrate portion of the heating element as well, and thus there is an effect of providing high space utilization.

BEST MODE

Figure 1:
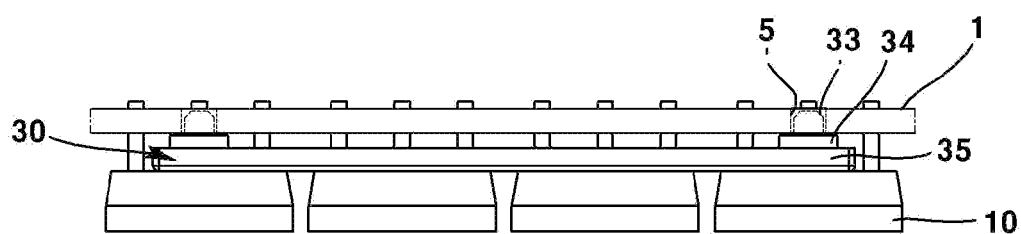
FIG. 1 is a front view of an electronic component assembly according to an embodiment of the present invention.

Hereinafter, preferred embodiments of the present invention will be described in detail with reference to the accompanying drawings.

However, the technical idea of the present invention is not limited to some embodiments to be described, but may be implemented in various forms, and if it is within the scope of the technical idea of the present invention, one or more of the components may be selected, combined, and substituted between the embodiments for use.

In addition, terms (including technical and scientific terms) used in the embodiments of the present invention are generally understood by those of ordinary skill in the technical field to which the present invention belongs unless explicitly defined and described, and it can be interpreted as a meaning, and terms generally used, such as terms defined in a dictionary, may be interpreted in consideration of the meaning in the context of the related technology.

In addition, terms used in the embodiments of the present invention are for describing the embodiments and are not intended to limit the present invention.

In the present specification, the singular form may include the plural form unless specifically stated in the phrase, and when described as "at least one (or more than one) of A and B and C", it may contain one or more of all combinations that can be combined with A, B, and C.

In addition, terms such as first, second, A, B, (a), (b), and the like may be used in describing the components of the embodiment of the present invention. These terms are only for distinguishing the component from other components, and are not limited to the nature, order, or sequence of the component by the term.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when it is described as being formed or disposed in the "top (upper side) or bottom (lower side)" of each component, the top (upper side) or bottom (lower side) not only includes a case when the two components are in direct contact with each other but also includes a case where one or more other components are formed or disposed between the two components. In addition, when expressed as "top (upper side) or bottom (lower side)", the meaning of not only an upward direction but also a downward direction based on one component may be included.

The electronic component assembly according to the present embodiment may be applied to any electronic device, but is preferably applied to a converter, and more preferably applied to a DC-DC converter. The DC-DC converter is an electronic device provided in automobiles, air conditioners, and the like, and refers to an electronic circuit device that performs conversion from a power source of a certain voltage to a power source of another voltage.

An electronic component assembly 100 according to an embodiment of the present invention comprises, as illustrated in FIG. 1, a substrate 1, a heating element 10 having a plurality of heat generating characteristics and being mounted at a predetermined distance apart from the lower end of the substrate 1, and a spacer 30 disposed between the heating element 10 and the substrate 1 to maintain a distance between each heating element 10 and a separation distance between the heating element 10 and the substrate 1.

The substrate 1 has various electronic components mounted thereon, and includes a plurality of first holes 5 for coupling with the spacer 30.

Further, the heating element 10 refers to an electronic component having high heat generating characteristics during operation, such as an FET, and in the present invention, four are mounted on the substrate 1 as a set, but the number is not limited thereto.

Figure 2:
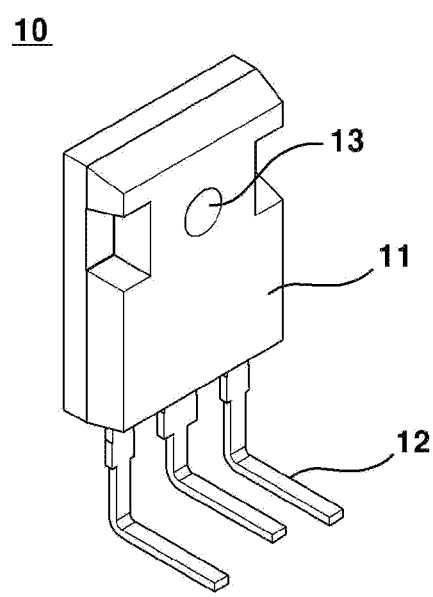
FIG. 2 is a perspective view of the heating element illustrated in FIG. 1.

Meanwhile, FIG. 2 is a perspective view illustrating one heating element 10, and as illustrated in the drawing, the heating element 10 includes a first body 11, three connection parts 12, and a second hole 13 formed in the first body 11.

Here, the first body 11 of the heating element 10 is disposed horizontally at the lower side of the substrate 1, and at this time, the connection part 12 is bent to have an angle of 90 degrees and then coupled to the substrate 1 and electrically connected to the substrate 1 in a form being soldered from the top.

That is, the first body 11 of the heating element 10 is disposed horizontally in the same direction as the substrate 1 and spaced a predetermined distance apart from each other.

Meanwhile, a spacer 30 is disposed between the heating element 10 and the substrate 1 to maintain a distance between the heating elements 10 and between the substrate 1 and the heating element 10.

Figure 3:
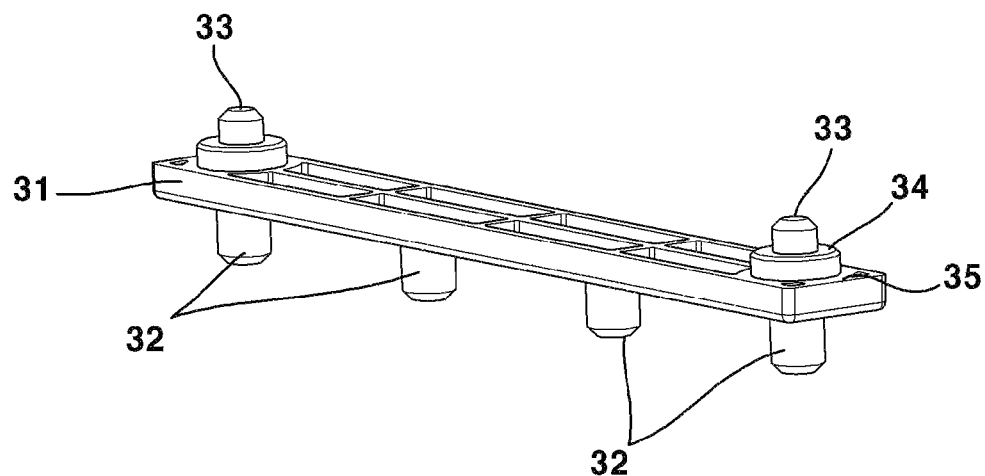
FIG. 3 is a perspective view of the spacer illustrated in FIG. 1.

FIG. 3 is a perspective view showing the configuration of the space 30. As illustrated in FIG. 3, the space 30 includes a second body 35 including an extension part 31 and a plurality of stoppers 33, and a first protrusion formed on an upper end of the stopper 34, and a plurality of second protrusions 32 formed at a lower end of the extension part 31.

Here, the extension part 31 is preferably configured in a flat plate shape, but the shape is not limited.

Meanwhile, the first protrusion 33 is formed on an upper end of the stopper 33 and is coupled to the first hole 5 formed in the substrate 1 playing the role of fixing the spacer 30 itself to the substrate 1.

Of course, the diameter of the first protrusion 33 must be formed to be smaller than the width or diameter of the stopper 33.

In addition, the stopper 33 serves to maintain the distance between the substrate 1 and the extension part 31, and it is preferable to form one stopper 33 at each end side of the extension part 31, and it is preferable that the first protrusion 34 is also formed equal to the number of stoppers 33.

The second protrusion 32 is inserted into the second hole 13 formed in the heating element 10, and it is preferable to form as many heating elements as the number of heating elements 10 are disposed on a single substrate 1 and to be disposed at a regular interval.

The distance between the substrate 1 and the first body 11 of the heating element 10 is equal to the height of the stopper 33 and the thickness of the extension part 31.

That is, since the height of the spacer 30 excluding the protrusions 32 and 33 determines the distance between the substrate 1 and the heating element 10, when actually designing the spacer 30, it is preferable to first calculate the required distance between the substrate 1 and the heating element 10 and then further determine the height of the extension part 31 and the stopper 33.

Figure 4:
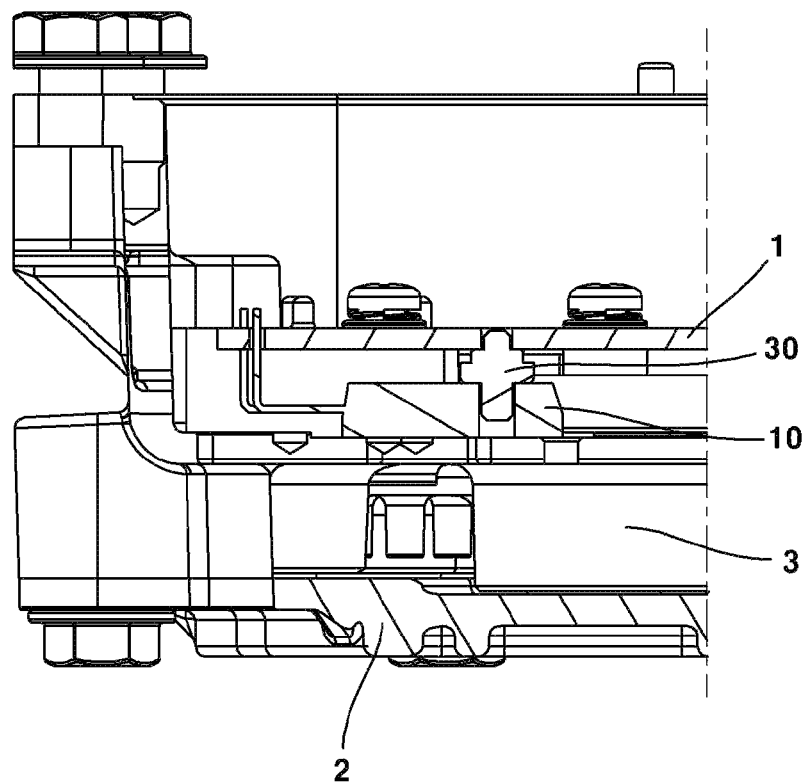
FIG. 4 is a cross-sectional view of a product being applied with an electronic component assembly according to an embodiment of the present invention.

Meanwhile, FIG. 4 is a cross-sectional view of an electronic component assembly 100 according to an embodiment of the present invention. As illustrated in the drawing, the spacer 30 is disposed between the substrate 1 and the heating element 10, and a lower surface of the heating element 10 is in contact with an upper surface of a housing 2 on which a cooling channel 3 is formed via a thermally conductive adhesive.

Here, the housing 2 is made of a metal material and a cooling channel 3 is formed therein, and thus serves as a heat sink and a case structure. In addition, a refrigerant for cooling the entire housing 2 is circulated in the cooling channel 3.

In addition, the upper surface of the housing 2 is configured to include a base in the shape of a planar surface, and a substrate 1 and the like is mounted on the base.

In addition, when the spacer 30 is made of a synthetic resin material having appropriate elastic properties, when the substrate 1 is seated on a case or a base, since there is an effect of pressing the heating element 10 in the direction of the upper surface of the housing 2, there is a very advantageous advantage in terms of heat dissipation.

That is, the spacer 30 has an effect of continuously maintaining a coupling force between the heating element 10 and the upper surface of the housing 2.

In the above, even though all the components constituting the embodiments of the present invention are described as being combined into one or operating in combination, the present invention is not necessarily limited to these embodiments. That is, within the scope of the object of the present invention, all the constituent elements may be selectively combined and operated in one or more. In addition, the terms 'include', 'consist of', or 'have' described above mean that the corresponding component can be present unless otherwise stated, so other components are excluded. It should not be construed as being able to further include other components. All terms, including technical or scientific terms, have the same meaning as commonly understood by one of ordinary skill in the art, unless otherwise defined. Terms commonly used, such as terms defined in the dictionary, should be interpreted as being consistent with the meaning of the context of the related technology, and are not interpreted as ideal or excessively formal meanings unless explicitly defined in the present invention.

The above description is merely illustrative of the technical idea of the present invention, and those of ordinary skill in the art to which the present invention pertains will be able to make various modifications and variations without departing from the essential characteristics of the present invention. Accordingly, the embodiments disclosed in the present invention are not intended to limit the technical idea of the present invention, but to explain the technical idea, and the scope of the technical idea of the present invention is not limited by these embodiments. The scope of protection of the present invention should be interpreted by the following claims, and all technical ideas within the scope equivalent thereto should be construed as being included in the scope of the present invention.

The invention claimed is:

1. An electronic component assembly comprising:
   a housing;
   a heating element disposed inside the housing;
   a substrate disposed on the heating element; and
   a spacer disposed between the heating element and the substrate,
   wherein the substrate has a first hole coupled to the spacer,
   wherein the heating element includes a first body having a second hole formed therethrough, and a connection part connected to the substrate, and
   wherein the spacer includes:
   a first protrusion coupled to the first hole;
   a second protrusion coupled to the second hole; and
   a second body disposed between the first protrusion and the second protrusion,
   wherein the second body of the spacer includes a stopper having a diameter larger than that of the first protrusion and an extension part connected to the stopper, and a portion of the stopper is in contact with the substrate.

2. The electronic component assembly according to claim 1, wherein the heating element is disposed on one surface of the housing and includes an upper surface in contact with the spacer.

3. The electronic component assembly according to claim 1, wherein the substrate includes a plurality of first holes, and the spacer includes a plurality of first protrusions.

4. The electronic component assembly according to claim 1, wherein a plurality of heating elements is provided,
   wherein the second body of the spacer includes a plurality of second protrusions, and
   wherein each of the plurality of second protrusions is coupled to the second hole of each of the plurality of heating elements.

5. The electronic component assembly according to claim 1, wherein the housing is made of a metal material and includes a cooling channel through which a refrigerant for cooling is circulated.

6. The electronic component assembly according to claim 1, wherein a heat conducting member is disposed on the contact surface between the heating element and the housing.

7. The electronic component assembly according to claim 4, wherein the plurality of heating elements is disposed to be spaced apart at an equal interval.

8. The electronic component assembly according to claim 1, wherein the spacer is formed of an elastic material or a plastic material.

9. The electronic component assembly according to claim 1, wherein a distance between the substrate and the first body is equal to a sum of a height of the stopper and a thickness of the extension part.

10. The electronic component assembly according to claim 5, wherein the cooling channel faces a lower surface of the heating element.

11. The electronic component assembly according to claim 10, wherein an adhesive is disposed between the cooling channel and the heating element.

12. The electronic component assembly according to claim 10, wherein a cross-sectional area of the first protrusion is smaller than a cross-sectional area of the stopper.

13. The electronic component assembly according to claim 10, wherein the heating element includes a FET.

14. A converter comprising:
a housing;
a heating element disposed inside the housing;
a cooling channel disposed in the housing and through which refrigerant circulates;
a substrate disposed on the heating element; and
a spacer disposed between the heating element and the substrate,
wherein the substrate has a first hole coupled to the spacer,
wherein the heating element includes a first body having a second hole formed therethrough, and a connection part connected to the substrate, and
wherein the spacer includes:
a first protrusion coupled to the first hole;
a second protrusion coupled to the second hole; and
a second body disposed between the first protrusion and the second protrusion,
wherein the second body of the spacer includes a stopper having a diameter larger than that of the first protrusion and an extension part connected to the stopper, and a portion of the stopper is in contact with the substrate.

15. The converter according to claim 14, wherein the heating element is disposed on one surface of the housing and includes an upper surface in contact with the spacer.

16. The converter according to claim 14, wherein the spacer is formed of an elastic material or a plastic material.

17. The converter according to claim 14, wherein a distance between the substrate and the first body is equal to a sum of a height of the stopper and a thickness of the extension part.

18. An electronic component assembly comprising:
a housing including a base;
a substrate disposed on the base;
a heating element disposed between the substrate and the base; and
a spacer disposed between the heating element and the substrate,
wherein the heating element is fixed to the base by the spacer and spaced apart from the substrate,
wherein the heating element includes a first body having a hole formed therethrough, and a connection part connected to the substrate,
wherein the spacer includes:
a first protrusion coupled to the substrate;
a second protrusion coupled to the hole; and
a second body disposed between the first protrusion and the second protrusion,
wherein the housing is made of a metal material and includes a cooling channel through which a refrigerant for cooling is circulated.

* * * * *